(12) United States Patent
Sacolick et al.

(10) Patent No.: US 8,558,547 B2
(45) Date of Patent: Oct. 15, 2013

(54) SYSTEM AND METHOD FOR MAGNETIC RESONANCE RADIO-FREQUENCY FIELD MAPPING

(75) Inventors: Laura Irene Sacolick, Niskayuna, NY (US); Mika Vogel, Enschede (NL); William Grissom, Munich (DE); Guido Kudielka, Freising (DE)

(73) Assignee: General Electric Company, Niskayuna, NY (US)

( * ) Notice: Subject to any disclaimer, the term of this patent is extended or adjusted under 35 U.S.C. 154(b) by 348 days.

(21) Appl. No.: 13/101,898

(22) Filed: May 5, 2011

(65) Prior Publication Data

US 2012/0280683 A1 Nov. 8, 2012

(51) Int. Cl.
*G01V 3/00* (2006.01)

(52) U.S. Cl.
USPC .......................................... 324/318; 324/309

(58) Field of Classification Search
USPC ............................ 324/300–322; 600/407–445
See application file for complete search history.

(56) References Cited

U.S. PATENT DOCUMENTS

| | | | |
|---|---|---|---|
| 7,254,435 B2* | 8/2007 | Zhang et al. ................. | 600/410 |
| 7,385,396 B2 | 6/2008 | Zhu | |
| 7,633,293 B2 | 12/2009 | Olson et al. | |
| 7,706,857 B2* | 4/2010 | Aletras et al. ................. | 600/410 |
| 8,198,891 B2* | 6/2012 | Sacolick et al. .............. | 324/307 |
| 8,305,077 B2* | 11/2012 | Morrell ......................... | 324/309 |
| 2010/0315084 A1 | 12/2010 | Sacolick et al. | |
| 2011/0001476 A1 | 1/2011 | Morrell | |
| 2011/0026799 A1 | 2/2011 | Nehrke et al. | |
| 2011/0213235 A1* | 9/2011 | Arai .............................. | 600/410 |

OTHER PUBLICATIONS

Brunner et al., "B1+ Interferometry for the Calibration of RF Transmitter Arrays", Magnetic Resonance in Medicine, vol. 61, Issue 6, pp. 1480-1488, Jun. 2009.
Sacolick et al., "B1 Mapping by Bloch-Siegert Shift", Magnetic Resonance in Medicine, vol. 63, Issue 5, pp. 1315-1322, May 2010.

* cited by examiner

*Primary Examiner* — Brij Shrivastav
(74) *Attorney, Agent, or Firm* — Scott J. Asmus

(57) ABSTRACT

A system and method for radio-frequency (RF) field mapping are provided. One method includes encoding a $B_1$ phase in at least one magnetic resonance (MR) excitation pulse as an encoded $B_1$ phase MR excitation pulse for at least a subset of a plurality of transmit channels within a magnetic resonance imaging (MRI) system. The method also includes encoding a $B_1$ magnitude in at least one off-resonance MR pulse as an encoded $B_1$ magnitude off-resonance MR pulse for at least a subset of the plurality of transmit channels within the MRI system. The method further includes determining one or more composite $B_1$ fields resulting from a transmission of the at least one encoded $B_1$ phase MR excitation pulse and the at least one encoded $B_1$ magnitude off-resonance MR pulse.

27 Claims, 10 Drawing Sheets

SYSTEM AND METHOD FOR MAGNETIC RESONANCE RADIO-FREQUENCY FIELD MAPPING

BACKGROUND

The subject matter disclosed herein relates generally to magnetic resonance imaging (MRI) systems, and more particularly to systems and methods for mapping radio-frequency (RF) fields for MRI systems having multiple transmit channels.

MRI or Nuclear Magnetic Resonance (NMR) imaging generally provides for the spatial discrimination of resonant interactions between RF waves and nuclei in a magnetic field. Specifically, MRI utilizes hydrogen nuclear spins of the water molecules in the human body, which are polarized by a strong, uniform, static magnetic field of a magnet. This magnetic field is commonly referred to as $B_0$ or the main magnetic field. When a substance, such as human tissue, is subjected to the main magnetic field, the individual magnetic moments of the spins in the tissue attempt to align with the main magnetic field. MRI data acquisition is accomplished by exciting magnetic moments within the primary magnetic field using transmit RF coils. In particular, these RF coils are pulsed to create RF magnetic field pulses in a bore of an MRI scanner to selectively excite a volume corresponding to the region of interest in order to reconstruct MR images of the region of interest using signals received by the RF coils.

There are a variety of techniques used to determine if the $B_1$ field produced by a magnetic resonance coil or array is homogeneous or to what degree the field is inhomogeneous. Such techniques are often referred to as $B_1$ mapping. In general, $B_1$ mapping techniques may either implement spatially or non-spatially resolved $B_1$ measurements. $B_1$ measurements are spatially resolved if one or more spatial encoding gradients are applied during acquisition and, in contrast, $B_1$ measurements are non-spatially resolved when spatial encoding gradients are not utilized during $B_1$ measurements. $B_1$ maps can be used, for example, to adjust transmit gain to produce an RF pulse at a specific flip angle, to design multi-transmit channel RF pulses, to aid in the implementation of chemical shift imaging, to correct images for shading resulting from $B_1$ inhomogeneity, to predict tissue heating distributions, or to calculate electrical properties of tissue, such as permittivity or conductivity. Some $B_1$ mapping techniques are also T1 dependent. That is, the signal utilized for $B_1$ is often weighted as a function of T1 relaxation. Other $B_1$ mapping techniques are $B_0$ or chemical shift dependent. Still other techniques are inaccurate over certain ranges of the $B_1$ field, and/or are dependent on large RF power depositions.

Additionally, phase-based $B_1$ mapping techniques are known and use the phase accrued from a $2\alpha$-$\alpha$ flip angle sequence to determine $B_1$. Although such a technique is more accurate than other techniques over a larger range of flip angles, such a technique is $B_0$ dependent and often relies on a relatively long repetition time (TR). Other phase-based $B_1$ mapping techniques utilize a $B_1$-dependent phase produced by adiabatic hyperbolic secant half and full-passage pulses. However, the specific absorption rate (SAR) associated with such techniques can limit the clinical application of such techniques at a high magnetic field.

$B_1$ mapping methods for MRI systems having multiple transmit coils have additional constraints. For example, multiple $B_1$ fields from multiple transmit coils must be measured in a clinically acceptable scanning time, and $B_1$ fields in such a system are typically less homogeneous than in MRI systems having a single transmit coil. $B_1$ mapping methods for a system with multiple transmit coils typically must also have good performance over a wide range of $B_1$ fields.

Thus, conventional techniques for $B_1$ mapping may have limitations over particular field ranges or require properties that limit the clinical applications of such methods.

BRIEF DESCRIPTION

In accordance with various embodiments, a non-transitory computer readable storage medium for radio-frequency (RF) field mapping using a processor is provided. The non-transitory computer readable storage medium includes instructions to command the processor to encode a $B_1$ phase in at least one magnetic resonance (MR) excitation pulse as an encoded $B_1$ phase MR excitation pulse for at least a subset of a plurality of transmit channels within a magnetic resonance imaging (MRI) system. The non-transitory computer readable storage medium further includes instructions to command the processor to encode a $B_1$ magnitude in at least one off-resonance MR pulse as an encoded $B_1$ magnitude off-resonance MR pulse for at least a subset of the plurality of transmit channels within the MRI system. The non-transitory computer readable storage medium also includes instructions to command the processor to determine one or more composite $B_1$ fields resulting from a transmission of the at least one encoded $B_1$ phase MR excitation pulse and the at least one encoded $B_1$ magnitude off-resonance MR pulse.

In accordance with other various embodiments, an MRI system is provided that includes an imaging portion having an imaging unit configured to acquire MR data, wherein the imaging portion includes a plurality of RF coils excited by a one or more pulses from a pulse generator using a plurality of transmit channels. The MRI system also includes a processing portion having a processor configured to generate the one or more pulses for the plurality of RF coils by (i) encoding a $B_1$ phase in the one or more pulses as an encoded $B_1$ phase excitation pulse for at least a subset of the plurality of transmit channels and (ii) encoding a $B_1$ magnitude in the one or more pulses, which are off-resonance, as an encoded off-resonance $B_1$ magnitude pulse for at least a subset of the plurality of transmit channels. The processing processor is further configured to determine one or more composite $B_1$ fields resulting from the transmission of the at least one encoded $B_1$ phase excitation pulse and the at least one encoded off-resonance $B_1$ magnitude pulse.

In accordance with still other various embodiments, a method for interference RF mapping for a parallel transmit MRI system is provided. The method includes encoding with a pulse generator a $B_1$ phase in at least one magnetic resonance (MR) excitation pulse as an encoded $B_1$ phase MR excitation pulse sequence for at least a subset of a plurality of transmit channels within the parallel transmit MRI system. The method also includes encoding with the pulse generator a $B_1$ magnitude in at least one off-resonance Bloch-Siegert MR pulses as an encoded $B_1$ magnitude off-resonance Bloch-Siegert MR pulse sequence for at least a subset of the plurality of transmit channels within the MRI system. The method further includes generating one or more encoded $B_1$ phase MR excitation pulse sequences or encoded $B_1$ magnitude off-resonance Bloch-Siegert MR pulse sequences with complex weighting using the pulse generator. The method additionally includes transmitting the encoded $B_1$ phase MR excitation pulse sequences or the encoded $B_1$ magnitude off-resonance Bloch-Siegert MR excitation pulse sequences using the plurality of transmit channels and determining with a processor one or more composite $B_1$ fields resulting from the transmission of the encoded $B_1$ phase MR excitation pulse sequences or the encoded $B_1$ magnitude off-resonance Bloch-Siegert MR excitation pulse sequences.

DETAILED DESCRIPTION

Figure 1:
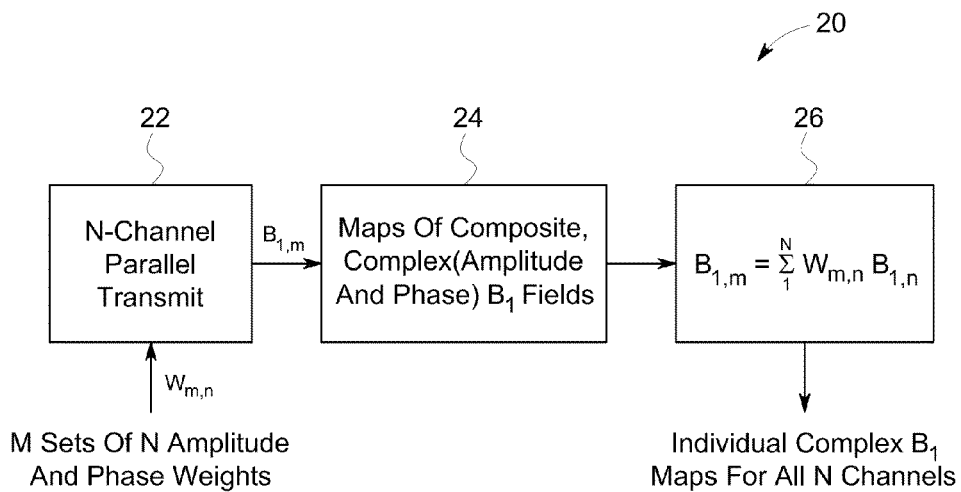
FIG. 1 is a simplified block diagram of a radio-frequency (RF) mapping process in accordance with various embodiments.

The foregoing summary, as well as the following detailed description of certain embodiments, will be better understood when read in conjunction with the appended drawings. To the extent that the figures illustrate diagrams of the functional blocks of various embodiments, the functional blocks are not necessarily indicative of the division between hardware. Thus, for example, one or more of the functional blocks may be implemented in a single piece of hardware or multiple pieces of hardware. It should be understood that the various embodiments are not limited to the arrangements and instrumentality shown in the drawings. Additionally, the system blocks in the various figures or the steps of the methods may be rearranged or reconfigured. Also, the steps of the various methods may be modified and performed in a different order or repeated as desired or needed.

As used herein, an element or step recited in the singular and proceeded with the word "a" or "an" should be understood as not excluding plural of said elements or steps, unless such exclusion is explicitly stated. Furthermore, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

Various embodiments provide systems and methods for radio-frequency (RF) field mapping, and in particular, $B_1$ mapping using magnetic resonance imaging (MRI). The $B_1$ mapping may be used for multi-channel parallel transmit applications. As described in more detail herein, in various embodiments complex $B_1$ field amplitude and phase are determined from Bloch-Siegert $B_1$ maps acquired for combinations of channels. By practicing various embodiments, at least one technical effect is higher signal to noise ratio (SNR) for $B_1$ mapping, such as for parallel RF transmissions with low $B_1$ fields.

Various embodiments provide $B_1$ mapping using MRI, which in one embodiment is a composite interference Bloch-Siegert mapping. The $B_1$ mapping of various embodiments may be implemented, for example, in connection with multi-channel MRI systems having two or more channels.

FIG. 1 illustrates one embodiment of an RF mapping process, in particular, a $B_1$ mapping process 20. The $B_1$ mapping process 20 illustrates generally $B_1$ mapping performed in accordance with various embodiments. A more detailed discussion of specific embodiments follows the general description. The $B_1$ mapping process 20 in one embodiment is based on a Bloch-Siegert shift. In particular, the $B_1$ mapping process 20 is used to measure the complex $B_1$ field, both amplitude and phase, from each of a plurality of channels. Accordingly, in the illustrated embodiment an N-channel parallel transmit operation is performed at 22, which may be performed using any suitable parallel transmit MRI scanner. The transmission of RF pulses at 22 from each of the channels, which are associated with multiple coils of the MRI system, include in one embodiment a plurality of off-resonance RF pulses to generate the Bloch-Siegert shift. The pulses may be applied sequentially to a plurality of different combinations (e.g., subsets) of the channels, for example, applied sequentially on all but one channel. It should be noted that the Bloch-Siegert shift generally refers to the shift in the true resonance frequency of the dipoles during the resonance of the object with the application of an off-resonance RF field. Thus, various embodiments include using at least one or more off-resonance RF pulses in a sequence for encoding the $B_1$. For example, in one embodiment the encoding includes any type of encoding that does not include an Actual Flip Angle Mapping (or AFI) method or a double angle method.

In one embodiment, as part of an N-channel parallel transmit operation, M sets of N amplitude and phase weights ($W_{m,n}$) are applied to each of the N channels. In this embodiment, $W_{m,n}$ is a complex weighting of each channel n, for each weighting combination m. The set of weights applied to each of the channels is different, such that each set of weights is unique. Using the weighted N-channel parallel transmit operation, maps of the complex, composite (amplitude and phase) $B_1$ fields ($B_{1,m}$) produced by each of the M channel weighting sets is acquired at 24. The complex, composite $B_1$ fields refers to the total RF field that is the result of the weighted combination of the multiple RF channels, which is the linear combination of the component individual channel $B_1$ fields. The total $B_1$ field generated by a combination of RF transmit coils is a linear superposition of the complex $B_1$ fields generated by the component individual channel $B_1$ fields. Thus, the composite fields are fields generated from multiple channels concurrently or simultaneously.

It should be noted that any suitable method for acquiring the $B_1$ amplitude may be used. For example, in one embodiment, $B_1$ mapping may be performed using the Bloch-Siegert shift as described in U.S. Patent Application Publication 2010/0315084, entitled "System, Method, And Apparatus For Magnetic Resonance RF-Field Measurement", which is commonly owned. Additionally, the $B_1$ phase may be determined using any suitable method. For example, using the phase difference between a plurality of N scans, relative phase difference information between the channel combinations may be determined.

Thus, $B_{1,m}$ is the complex, composite $B_1$ field for weighting combination m, with M total combinations. Additionally, $B_{1,n}$ is the complex $B_1$ field from a single channel, with N total number of parallel transmit channels. In various embodiments, using the measurement of $B_{1,m}$, $B_{1,n}$, which is the individual complex $B_1$ fields for all of the N transmit channels, is calculated at 26, using the following:

$$B_{1,m} = \sum_{i}^{N} w_{m,n} B_{1,n} \qquad \text{Equation 1}$$

As described in more detail herein, to calculate $B_{1,n}$, inverted Equation 1 is used. For example, in one embodiment, the calculation is as follows: $B_{1,m} = |B_1|*\exp(i*\arg(B_1))$, where $|B_1|$ is determined from the Bloch-Siegert B1 maps, and $\arg(B_1)$ is determined from the phase map scan. Thereafter, Equation 1 is inverted to determine $B_{1,n}$, resulting in the individual $B_1$ fields for all N transmit channels. Accordingly, because the linear coefficients used to obtain the $B_1$ maps are known, the inversion process results in the determination of the individual coil maps.

Thus, in one embodiment, the composite $B_1$ field amplitudes $|B_{1,m}|$ (magnitude) are measured by the Bloch-Siegert shift method and the phase of the composite fields $\angle B_{1,m}$ are measured from the image phase resulting when the imaging signal is excited by channel combination m. It should be noted that the amplitude and phase measurements are separate measurements. In particular, the amplitude and phase are measured and calculated using different physical basis. However, the imaging scans used to calculate amplitude and phase may be separate scans or may be combined, where amplitude and phase data can be extracted from the same scans or pulse sequences.

Different methods are contemplated for performing $B_1$ mapping in accordance with the embodiments described herein. In general, one or more methods include apply Bloch-Siegert RF pulses on a combination of MRI channels and not on all of the channels. This application of Bloch-Siegert RF pulses on a combination of MRI channels creates a non-uniform field with Bloch-Siegert mapping. In one embodiment, the $B_1$ fields of individual coils of a parallel transmit system (e.g., high count parallel transmit system) are measured by measuring the composite field patterns from the off-resonance Bloch-Siegert pulses on N−1 channels. It should be noted that this process may be an iterative process, for example based on the type of MRI system used (e.g., a greater than 3T system) and the level of the base starting $B_1$ inhomogeneity.

It should also be noted that although the various embodiments may be described using a particular method to determine a particular property, for example, using a particular transmit scheme, such as using a Bloch-Siegert shift $B_1$ mapping transmit scheme, variations and modifications are contemplated.

Figure 2:
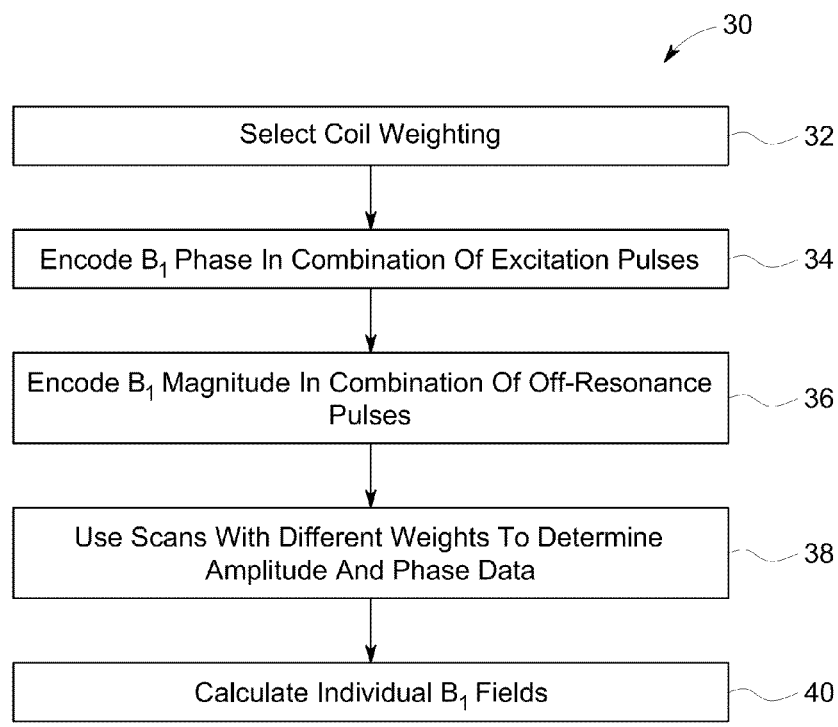
FIG. 2 is a flowchart of a method of performing interference RF field mapping in accordance with various embodiments.

Various embodiments provide a method 30 as shown in FIG. 2 to perform interference RF field mapping, which in some embodiments, includes using the Bloch-Siegert shift. The method 30 will first be generally described followed by a detailed description of each of the steps (e.g., different types and variations of scans that can be used).

The method 30 includes selecting coil weighting at 32 for use in generating the excitation pulses (RF pulses). Thereafter, the $B_1$ phase is encoded in a combination of excitation pulses at 34 based on the selected coil weighting and the $B_1$ magnitude is encoded in a combination of excitation pulses at 36. It should be noted that the encoding of the $B_1$ phase and the $B_1$ magnitude may be with the same combination of excitation pulses or different combinations of excitation pulses. Thus, the encoding may be performed simultaneously, concurrently or sequentially.

It should be noted that the weighting may be selected based on one or more different factors or criteria. For example, the weighting may be selected based on at least one of optimizing a conditioning for the inverse problem solution, reducing or minimizing noise or noise sensitivity, or reducing or minimizing a specific absorption rate.

Thereafter, at 38, the encoded scans with different weights (from one or more pulse sequences) are used to determine amplitude and phase data. Then, the individual $B_1$ fields are calculated as described in more detail herein.

It should be noted that both the composite and individual channel $B_1$ fields are complex, having both a magnitude and phase. In various embodiments, Bloch-Siegert $B_1$ mapping is used to measures only the $B_1$ field magnitude, and an additional scan or set of scans (or different encoding) is used to determine the phase of the N different composite $B_1$ fields.

The method 30 may be performed for any N-channel parallel transmit MRI system. For example, in one implementation N Bloch-Siegert $B_1$ maps are determined for composite combinations of all but one channel. This mapping corresponds to a weighting function of $w_{m,n}=0$ for m=n, and $w_{m,n}=1$ otherwise. N phase scans are performed for the same composite combinations of all but one channel. One embodiment of a phase scan includes acquiring images where the excitation is performed with these same combinations of all but one channel. The phase difference between the N scans provides the relative phase difference between the channel combinations. The individual $B_1$ maps are then determined as described above and using Equation 1.

Thus, in some embodiments, a $B_1$ phase (e.g., $B_1$ phase signal information) is encoded in a plurality of MR excitation pulses for a plurality of transmit channels within the MRI system and a $B_1$ magnitude (e.g., $B_1$ magnitude signal information) is encoded in a plurality of off-resonance MR excitation pulses for the plurality of transmit channels within the MRI system. Then, one or more composite $B_1$ fields are determined as a result of transmissions of the $B_1$ phase encoded and $B_1$ magnitude encoded MR excitation pulses using the MRI system. Thereafter, one or more $B_1$ fields for the plurality of channels are calculated using the determined composite $B_1$ fields.

Each of the steps of the method 30 will now be described in detail. In particular, with respect to the selection of coil weighting at 32, different complex weighting schemes may be used. For example, as described above, channel weights $w_{m,n}=0$ for m=n, $w_{m,n}=1$ for m≠n may be selected. This results in N combinations of channels, where the RF is from N−1 channels at a time, and one channel is not used (i.e., not excited). The one channel not used is rotated to be each of the N transmit coils, for a total of N scans. However, it should be noted that more than one channel may not be used, which may be adjacent channels, alternating channels, etc.

With respect to the $B_1$ phase encoding at 34 and the $B_1$ magnitude encoding at 36, this encoding may be performed with a set of scans having the phase and amplitude data acquired separately or in the same scan(s) or sequences. Thus, the same or different scans or sequences may be used to determine the amplitude and phase of the RF field for RF mapping, such as by using Bloch-Siegert mapping amplitude scan(s) and any suitable phase mapping scan to obtain a weighted combination of the channels.

Figure 3:
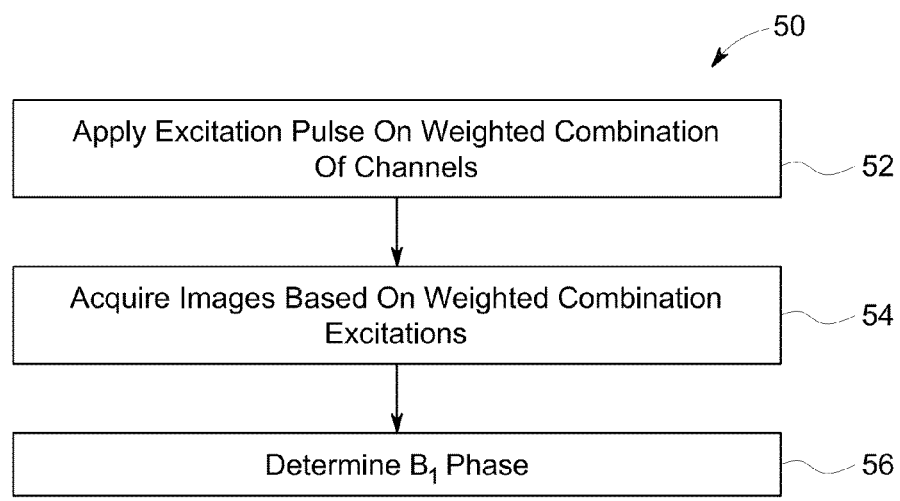
FIG. 3 is a flowchart of a method of performing a phase scan in accordance with various embodiments.
Figure 5:
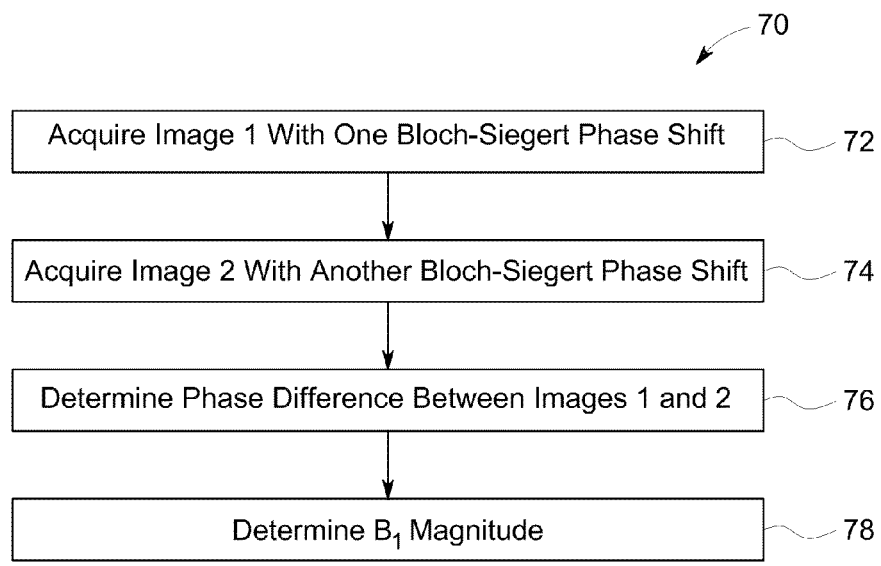
FIG. 5 is a flowchart of a method of performing a $B_1$ magnitude scan in accordance with various embodiments.

For example, when using separate scans, namely one scan or set of scans with phase encoding and one scan or set of scans with amplitude encoding, the methods 50 and 70, respectively, as shown in FIGS. 3 and 5 may be used. With respect to the $B_1$ phase scan, the method 50 shown in FIG. 3 may be performed in various embodiments. The method 50 includes applying excitation pulses (which may have the same or different amplitude) on a weighted combination of channels at 52, for example, using weights $w_{m,n}$. In one embodiment, which is a simple implementation, the excitation pulses are applied on all-but-one channel (as defined by the weighting). The missing channel is rotated, such that M=N images are acquired at 54 based on the weighted combination of excitations. The $B_1$ phase is then determined at 56. For example, the phase of each of the N images is determined as $\angle B_{1,m} + \phi_{img}$, where $\phi_{img}$ is a background image phase common to all N images, and is the result of the receive coil phase, $B_0$ field inhomogeneity, eddy currents, etc.

Figure 4:
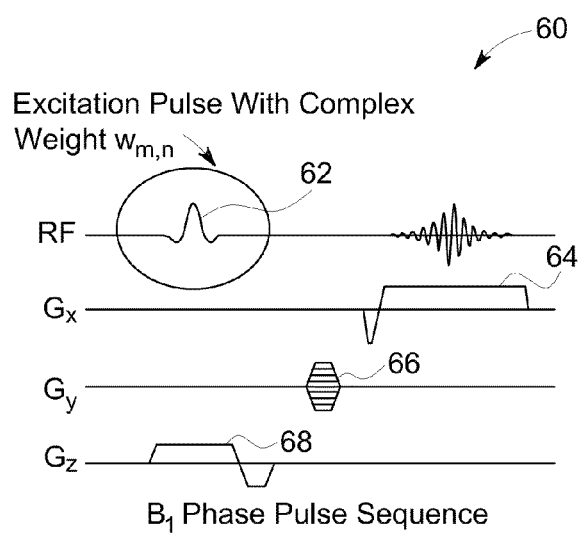
FIG. 4 is a diagram of a $B_1$ phase pulse sequence generated in accordance with one embodiment.

It should be noted that the background image phase is common to all images and is ignored in various embodiments, as only the relative phase between channels is measured. It also should be noted that the phase data acquired using the method 50 may be determined using any suitable phase mapping scan, such as by acquiring spin echo images and generating phase maps using real and imaginary components of the images. Thus, as shown in FIG. 4, which illustrates a $B_1$ phase pulse sequence 60, an excitation pulse 62 with a complex weight $w_{m,n}$ is applied with gradient pulses 64, 66 and 68, which may be generated using any suitable gradient pulse scheme, such as based on the type of scan to be performed.

With respect to the $B_1$ magnitude scan, the method 70 shown in FIG. 5 may be performed in various embodiments. The method 70 generally includes adding an off-resonance RF pulse to an imaging sequence to provide a $B_1$ sensitive Bloch-Siegert phase shift. The Bloch-Siegert $B_1$ mapping maps the amplitude of the off-resonance RF pulse in the sequence. In one embodiment, the pulse is applied with equal amplitudes on a weighted combination of channels, for example, using weights $w_{m,n}$. In one simple implementation, the excitation pulses are again applied on all-but-one channel. In the various embodiments, the method 70, which is implemented as a Bloch-Siegert shift method, calculates the $B_1$ amplitude from the phase difference between two images, such that two images per channel are acquired. Accordingly, in various embodiments, 2×N images are used to calculate $|B_{1,m}|$ for the N channels.

Thus, in one embodiment the method 70 for $B_1$ mapping to determine the $B_1$ field amplitude (or magnitude) includes acquiring at 72 a first image (Image 1) with one Bloch-Siegert phase shift. For example, in one embodiment an off resonance image with positive frequency offset (e.g. +4 KHz from Larmor frequency) is acquired. Thereafter, another image (Image 2) with another Bloch-Siegert phase shift is acquired at 74. For example, in one embodiment, an off resonance image with negative frequency offset (e.g. −4 KHz from Larmor frequency) is acquired. The images (Images 1 and 2), may be acquired using any suitable MRI image acquisition technique such as using Bloch-Siegert phase shift or off resonance imaging. After acquiring the images, the phase difference of the two images is determined at 76, such as by using a suitable pixel subtraction method.

Figure 6:
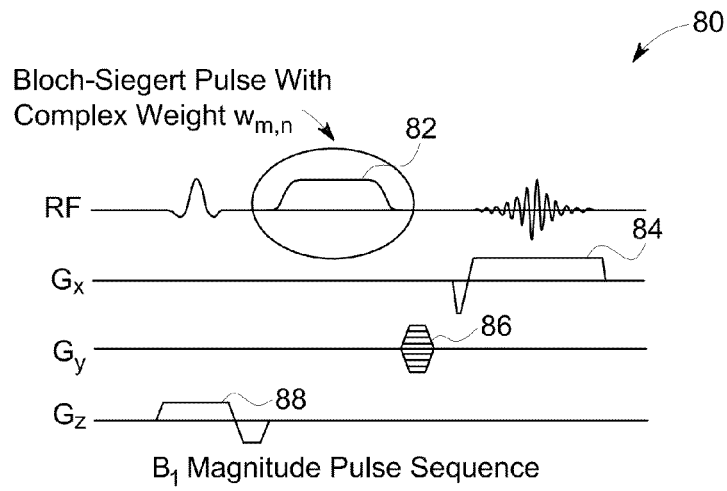
FIG. 6 is a diagram of a $B_1$ magnitude pulse sequence generated in accordance with one embodiment.

The $B_1$ map for each image slice then may be determined at 78, for example, by multiplying the phase difference by a scaling factor to realize the $B_1$ maps (magnitude) for each image slice. Thus, as shown in FIG. 6, which illustrates a $B_1$ magnitude pulse sequence 80, an excitation pulse 82, which in this embodiment is a Bloch-Siegert excitation pulse with a complex weight is applied with gradient pulses 84, 86 and 88, which may be generated using any suitable gradient pulse scheme, such as based on the type of scan to be performed.

It should be noted that any suitable method for $B_1$ mapping may be used to determine the $B_1$ magnitude and the described method is merely one example. For example, $B_1$ mapping using a Bloch-Siegert shift may be used as described in U.S. Patent Application Publication 2010/0315084.

Figure 7:
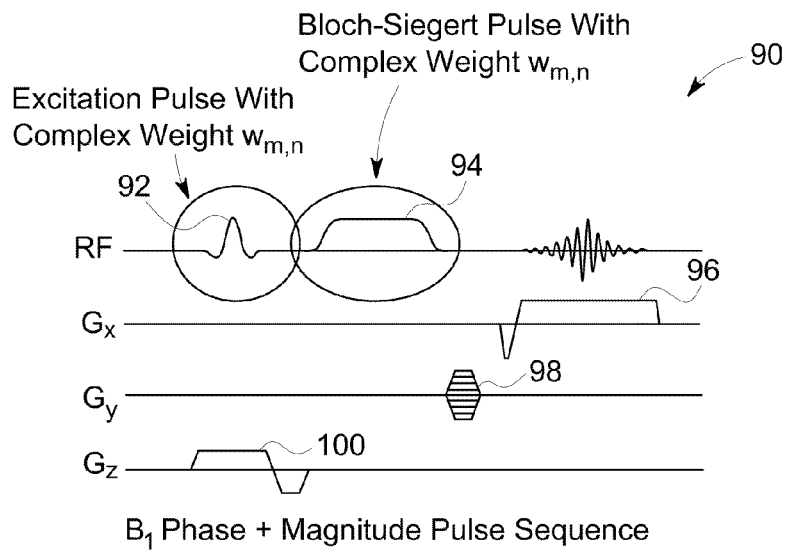
FIG. 7 is a diagram of a combined $B_1$ phase and magnitude pulse sequence generated in accordance with one embodiment.

In other embodiments, the same scans optionally may be used to determine the amplitude and phase of the RF field for RF mapping, such as by using Bloch-Siegert mapping amplitude scan(s) and any suitable phase mapping scan to obtain a weighted combination of the channels at the same time. For example, as shown in FIG. 7, which illustrates a combined $B_1$ phase+magnitude pulse sequence 90, excitation pulses 92 and 94, which in this embodiment are an excitation pulse and a Bloch-Siegert pulse, respectively, both with a complex weight $w_{m,n}$, are applied with the gradient pulses 94, 96 and 100, which may be generated using any suitable gradient pulse scheme, such as based on the type of scan to be performed.

Thus, in this embodiment, the excitation pulse is used to encode $B_1$ phase and the off-resonance Bloch-Siegert pulse is used to encode $B_1$ amplitude. In various embodiments, 2×N images are acquired with the Bloch-Siegert pulse applied at positive and negative off-resonance frequency. It should be noted that both the excitation and off-resonance pulses use the same set of coil weights $w_{m,n}$. However, the index m does not have to be the same for both the excitation pulse and the Bloch-Siegert pulse. For example, with the all-but-one coil weighting scheme, in one acquisition, and using a multichannel MRI system, such as an eight chancel system, the excitation pulse can be applied to all but coil #4, and the Bloch-Siegert pulse on all but coil #1. Thus, in one embodiment, the scans are performed as follows:

Scan 1: Image phase(scan m, Bloch-Siegert+frequency)=$\angle B_{1,m} + \phi_{BS(m,+freq)} + \phi_{img}$ Scan 2: Image phase(scan m, Bloch-Siegert−frequency)=$\angle B_{1,m} + \phi_{BS(m,-freq)} + \phi_{img}$ where $\phi_{BS(m,+freq)}$ is the phase from the Bloch-Siegert shift, for the off-resonance pulse at positive off-resonance frequency. It should be noted that the scan is repeated for all m combinations In various embodiments, making the assumption that $\phi_{BS(m,+freq)} = -\phi_{BS(m,-freq)}$, then averaging scans 1 and 2, gives $\angle B_{1,m} + \phi_{img}$. Then, taking the phase difference between scans 1 and 2 gives $\phi_{BS(m,freq)}$, which gives the $B_1$ magnitude $|B_{1,m}|$. It should be noted that the assumption that $\phi_{BS(m,+freq)} = -\phi_{BS(m,-freq)}$ may be used for $B_0$ inhomogeneity within a predetermined range (e.g., a range defined between a low and high inhomogeneity). However, in some embodiments, the accuracy of the calculation of the $B_1$ phase may be increased by exactly calculating $\phi\phi_{BS(m,+freq)}$ and $-\phi_{BS(m,-freq)}$ with $B_0$ information from an additional $B_0$ map scan.

Figure 8:
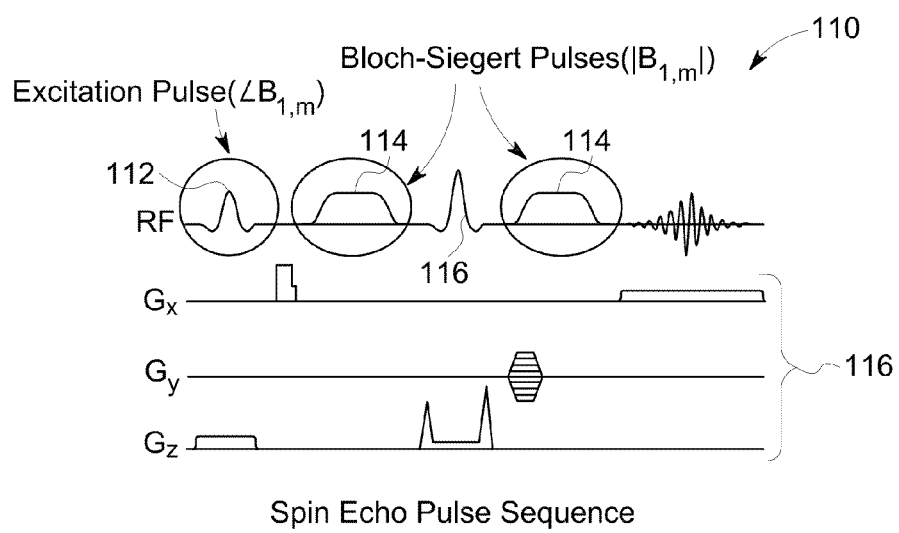
FIG. 8 is a diagram of a spin echo pulse sequence generated in accordance with one embodiment.
Figure 9:
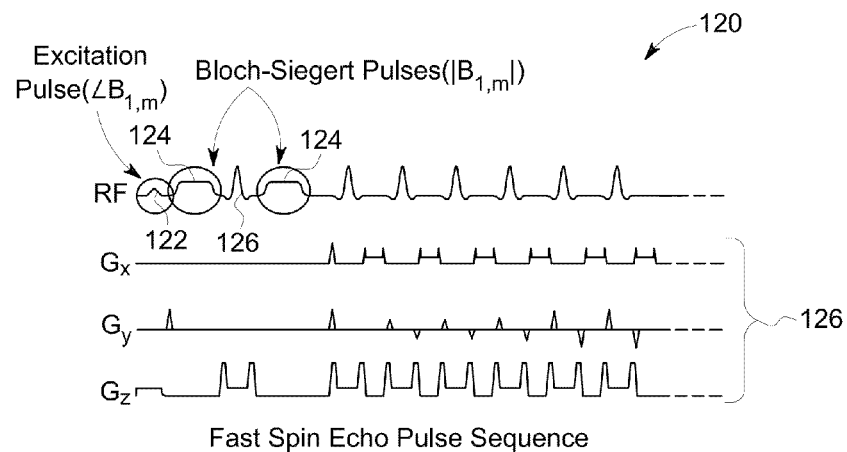
FIG. 9 is a diagram of a fast spin echo pulse sequence generated in accordance with one embodiment.

It should be appreciated that the illustrated pulse sequences are one (and a simple) example of how the various embodiments may be implemented. Accordingly, the $B_1$ phase can be encoded in any type or combination of excitation pulse(s) and the $B_1$ magnitude can be encoded in any type or combination of off-resonance pulse(s) with any combination of off-resonance frequencies, including combinations that do not include both positive and negative off-resonance frequencies. The sequence can include other pulses not used for either $B_1$ amplitude or phase encoding. For example, the methods described herein can be applied in a spin echo sequence 110 as shown in FIG. 8 or a fast spin echo pulse sequence 120 as shown in FIG. 8, where the refocusing pulse 116 or 126 may not be used for $B_1$ encoding, with the encoding provided using the excitations pulse 112 or 122, and the Bloch-Siegert pulses 114 and 124. The encoding and refocusing pulses are applied with gradient pulses 116 and 126, respectively, which may be generated using any suitable gradient pulse scheme, such as based on the type of scan to be performed.

It should be noted that as used herein an "excitation pulse" can refer to any RF pulse that excites a signal. Additionally, "off-resonance" or "Bloch-Siegert" pulse as used herein generally refers to an RF pulse where the frequency is offset from the spin resonance frequency. Moreover, "image" as used herein can refer to any type of image of any type of region of interest, for example, a 3D spatially resolved volume, 2D spatially resolved slice(s), 1D spatially resolved columns or projections, or a non-spatially resolved signal spectrum.

Figure 10:
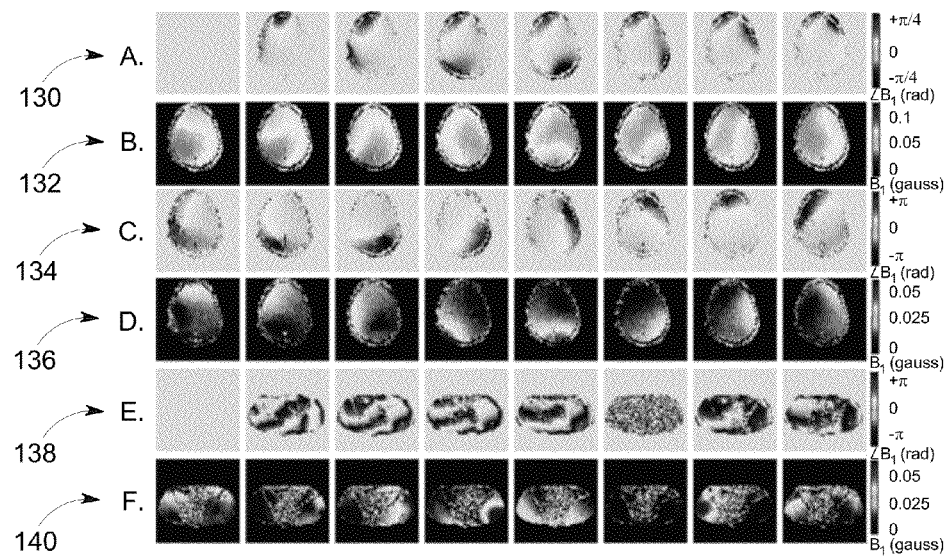
FIG. 10 are magnetic resonance (MR) images generated in accordance with various embodiments.

Images acquired using a multi-channel MRI system provided in accordance with various embodiments are illustrated in FIG. 10. The images 130 are $B_1$ phase images acquired using a weighted combination of seven channels (namely seven channels transmitting at full power and one channel off). The images 132 are $B_1$ amplitude images acquired using a weighted combination of seven channels. As described in more detail herein, the "off" channel is rotated. Thus, the images 130 are for a seven composite channel $B_1$ phase $\angle B_{1,m}$ (relative to channel 1) and the images 132 are for a seven composite channel $B_1$ magnitude $|B_{1,m}|$. The images 134 are for individual coil $B_1$ phase $\angle B_{1,n}$ (relative to channel 1) and the images 136 are for individual coil $B_1$ magnitude $|B_{1,n}|$. The images 138 are for individual coil $B_1$ phase, abdomen in an eight channel body coil and the images 140 are for individual coil $B_1$ magnitude in an eight channel body coil, wherein channel 6 is dead/off. It should be noted that the total scan time ($B_1$ magnitude+phase scans) in one embodiment is within a clinically acceptable range, such as 10.2 sec/channel (for a head scan) and 14.1 sec/channel (for a body scan).

Thus, in various embodiments, the $B_1$ amplitude is encoded in the image via the Bloch-Siegert phase shift and the $B_1$ phase is separately encoded. Accordingly, in some embodiments, both the $B_1$ phase and amplitude may be encoded in the same scan from multiple coils. Additionally, scans with the off-resonance Bloch-Siegert pulse having different complex weights are combined to calculate single channel $B_1$ amplitude maps. Accordingly, in various embodiments, with 2×N scans, with the optional addition of information from a $B_0$ map, the $B_{1,m}$ phase and amplitude is calculated with the excitation pulse encoding $B_{1,m}$ phase, and the off-resonance pulse encoding $B_{1,m}$ amplitude. Thereafter, from the composite $B_{1,m}$ fields, single channel $B_{1,n}$ fields may be determined.

Figure 11:
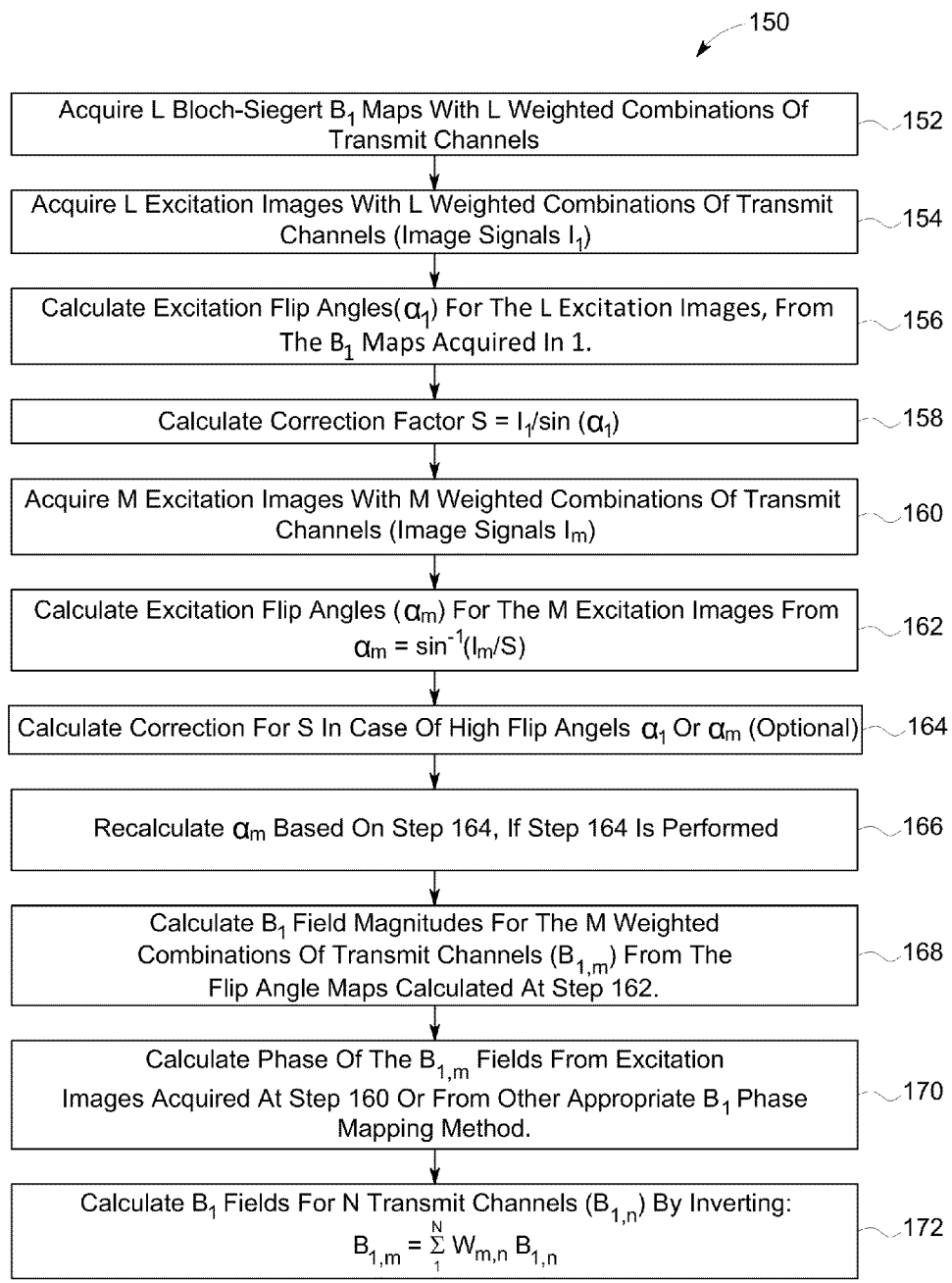
FIG. 11 is a flowchart of a method of performing interference RF field mapping in accordance with other various embodiments.

Variations and modifications to the RF field mapping are contemplated. For example, FIG. 11 illustrates a method 150 to perform interference RF field mapping, which in some embodiments, includes using the Bloch-Siegert shift. The method 150 calculates an approximation of the $B_1$ maps instead of directly calculating the $B_1$ maps. In particular, the method 150 includes acquiring at 152 L Bloch-Siegert shift $B_1$ maps. For example, $B_1$ magnitude mapping may be performed using the Bloch-Siegert shift for L combinations of transmit channels. In one embodiment, L=1, which can be one Bloch-Siegert $B_1$ map for a weighted combination of all transmit channels.

Thereafter, at 154, L excitation images are acquired. For example, excitation images may then be acquired with the same L combinations of transmit channels. In the embodiment of L=1, this process includes acquiring one excitation image with the same weighted combination of transmit channels for the excitation pulse(s). The excitation image signal is represented by $I_1$.

The excitation flip angles are then calculated at 156. For example, the excitation flip angle $\alpha_1$ for the image(s) $I_1$ acquired at 154 is calculated from the $B_1$ map acquired at 152 using any suitable method to calculate a flip angle from $B_1$. Then, a correction factor S is calculated at 158 where $S=I_1/\sin(\alpha_1)$.

For reference (but not used in the calculation), the imaging sequence is a gradient echo sequence defined as follows:

$$S = M_0 B_1^{-} \frac{(1-e^{-TR/T_1})e^{-TE/T_2}}{1-e^{-TR/T_1}\cos(\alpha_l)} \quad \text{Equation 2}$$

where:
$I_1$=excitation image signal for transmit channel combination m
$\alpha_1$=excitation flip angle for transmit channel combination m
$M_0$=equilibrium longitudinal magnetization in subject
$B_1^{-}$=receive coil sensitivity
TR=repetition time of excitation image pulse sequence
TE=echo time of excitation image pulse sequence
$T_1, T_2$=relaxation time constants of subject.

Another set of M excitation images are acquired at 160 with M weighted combinations of transmit channels. These weighted combinations can also be single transmit channels. These excitation image signals are represented by $I_m$. Then, the excitation flip angle(s) $\alpha_m$ for the image(s) $I_m$ acquired at step 160 are calculated at 162 as $\alpha_m=\sin^{-1}(I_m/S)$, where $\sin^{-1}$ is the inverse sine (arcsine). It should be noted that the "=" in the equation is an approximation which holds for small flip angles $\alpha_m, \alpha_1$.

A correction can optionally be calculated at 164 for S for high flip angles $\alpha_m, \alpha$. Then, $\alpha_m$ is recalculated more accurately at 166 based on step 164, if step 164 is performed. It should be noted that steps 164 and 166 optionally are iteratively repeated.

The $B_1$ field magnitudes for the M weighted combinations of transmit channels $B_{1,m}$ are thereafter calculated at 168 from the excitation flip angles $\alpha_m$ calculated at 162 by any suitable method to calculate the $B_1$ magnitude from the flip angle. Then, the $B_1$ phase $\arg(B_{1,m})$ is calculated at 170 by any suitable $B_1$ phase calculation method, including from the M excitation images acquired at 160. The $B_1$ fields for the N transmit channels are then calculated at 172 by inverting Equation 1, as described herein.

Figure 12:
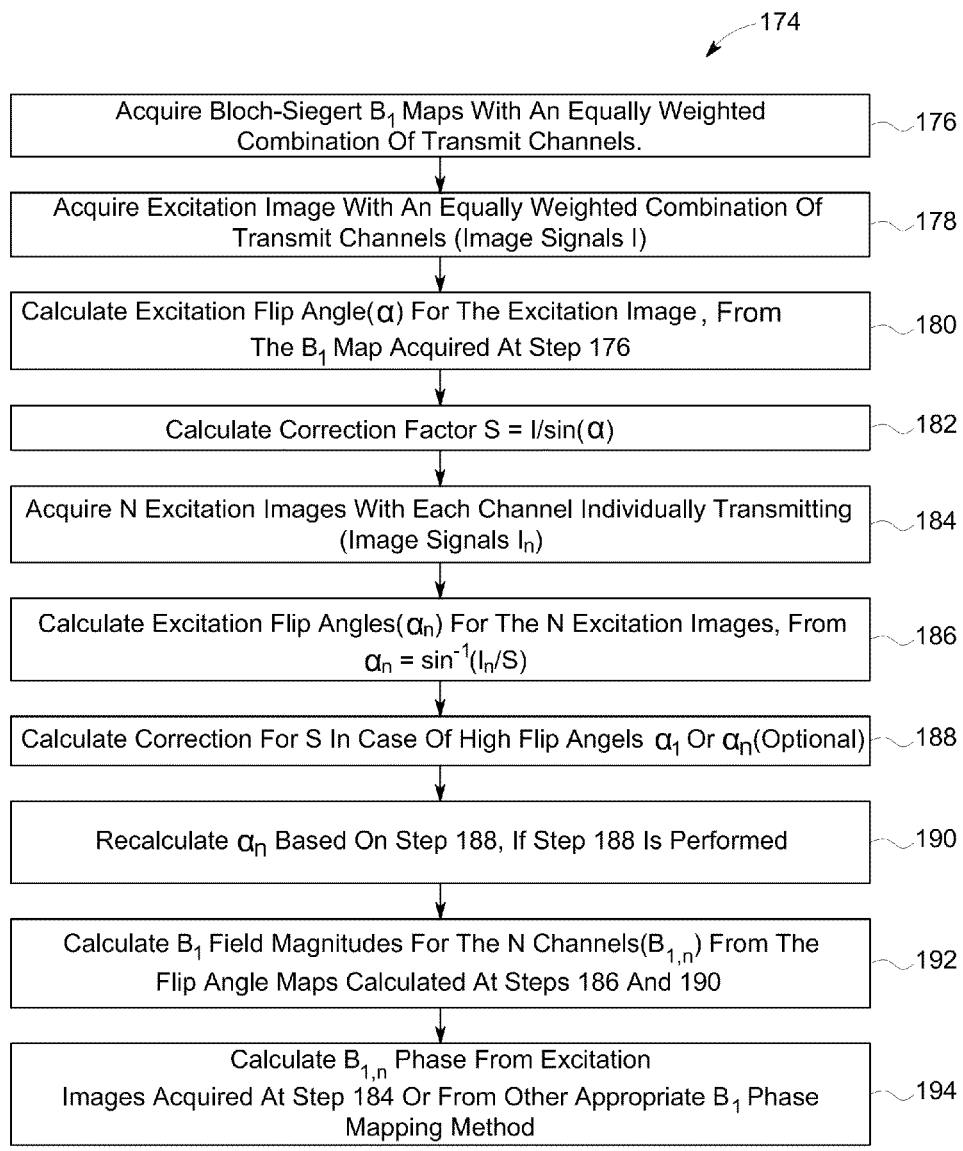
FIG. 12 is a flowchart of a method of performing interference RF field mapping in accordance with other various embodiments.

As another example, FIG. 12 illustrates a method 174 to perform interference RF field mapping using a weighted combination of channels. The method 174 provides data acquisition in a different manner. In particular, at 176 Bloch-Siegert $B_1$ maps are acquired with an equally weighted combination of transmit channels. Thereafter, an excitation image with an equally weighted combination of transmit channels is acquired at 178, having an image signal (I). The excitation flip angle (α) for the excitation image acquired at 178 is calculated from the $B_1$ map acquired at 176. A correction factor $S=I/\sin(\alpha)$ is then calculated at 182.

Thereafter, N excitation images are acquired at 184 with each channel individually transmitting, wherein the image signals are represented by $I_n$. Then, the excitation flip angles ($\alpha_n$) for the N excitation images acquired at 184 are calculated at 186 from $\alpha_n = \sin^{-1}(I_n/S)$. The correction for S in the case of high flip angles $\alpha_1$ or $\alpha_n$ optionally is calculated at 188. Thereafter, at 190, $\alpha_n$ is calculated based on step 188, if step 188 is performed. Steps 188 and 190 optionally are iteratively repeated.

The $B_1$ field magnitudes for the N channels ($B_{1,n}$) are calculated at 192 from the flip angle maps calculated at steps 186 and 190. The $B_{1,n}$ phase is calculated at 194 from the excitation images acquired at 184 or from any other suitable $B_1$ phase mapping method.

Figure 13:
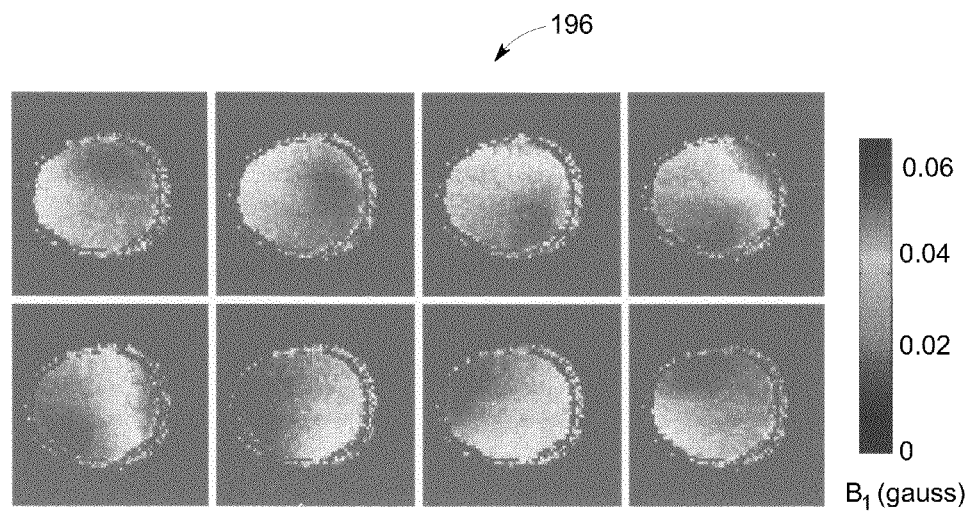
FIG. 13 are magnetic resonance (MR) images generated in accordance with various embodiments using the method of FIG. 12.

Images acquired with a multi-channel MRI system using the method 174 provided in accordance with various embodiments are illustrated in FIG. 13. The images 196 are $B_1$ magnitude maps acquired for eight transmit channels with the method 174.

Figure 14:
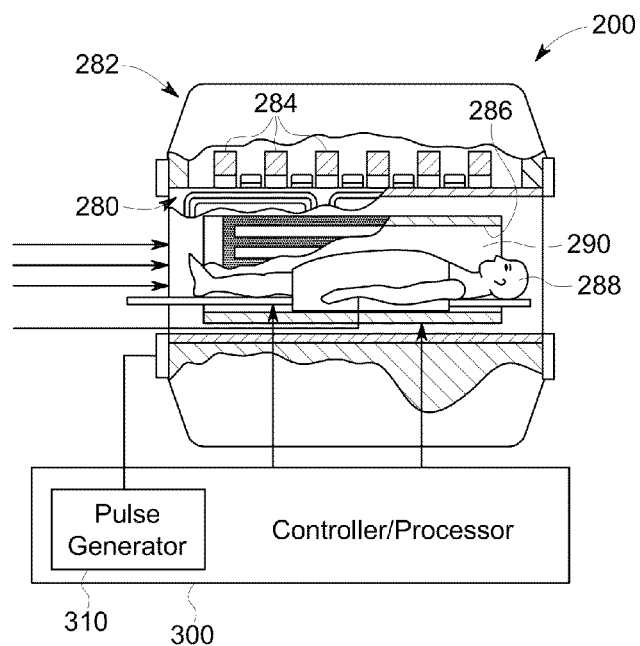
FIG. 14 is a schematic block diagram of a portion of a magnetic resonance imaging (MRI) system formed in accordance with various embodiments.

Thus, as shown in FIG. 14, a controller/processor 300 may form part of an MRI system 200. The controller/processor 300 may control operations or generate MRI signals for controlling the MRI system 300, including generating the pulse sequences as described herein. The controller/processor 300 may be any type of processing unit, for example, a CPU, and includes a pulse generator 310 configured to generate one or more pulses in accordance with various embodiments (or other pulses).

In the MRI system 200, a gradient coil assembly 280 forms part of a magnet assembly 282 that includes a polarizing magnet 284 and a whole-body RF coil 286. A patient 288 may be positioned within a cylindrical patient imaging volume 290 of the magnet assembly 282. The controller/processor 300 produces pulses that may be amplified by an RF amplifier (not shown) and used to drive the RF coil 286. The resulting signals emitted by the excited nuclei in the patient 288 may be sensed by the same RF coil 286 and preamplified. The amplified MR signals are demodulated, filtered and digitized in the receiver section of the transceiver and may be used to form MR images.

Figure 15:
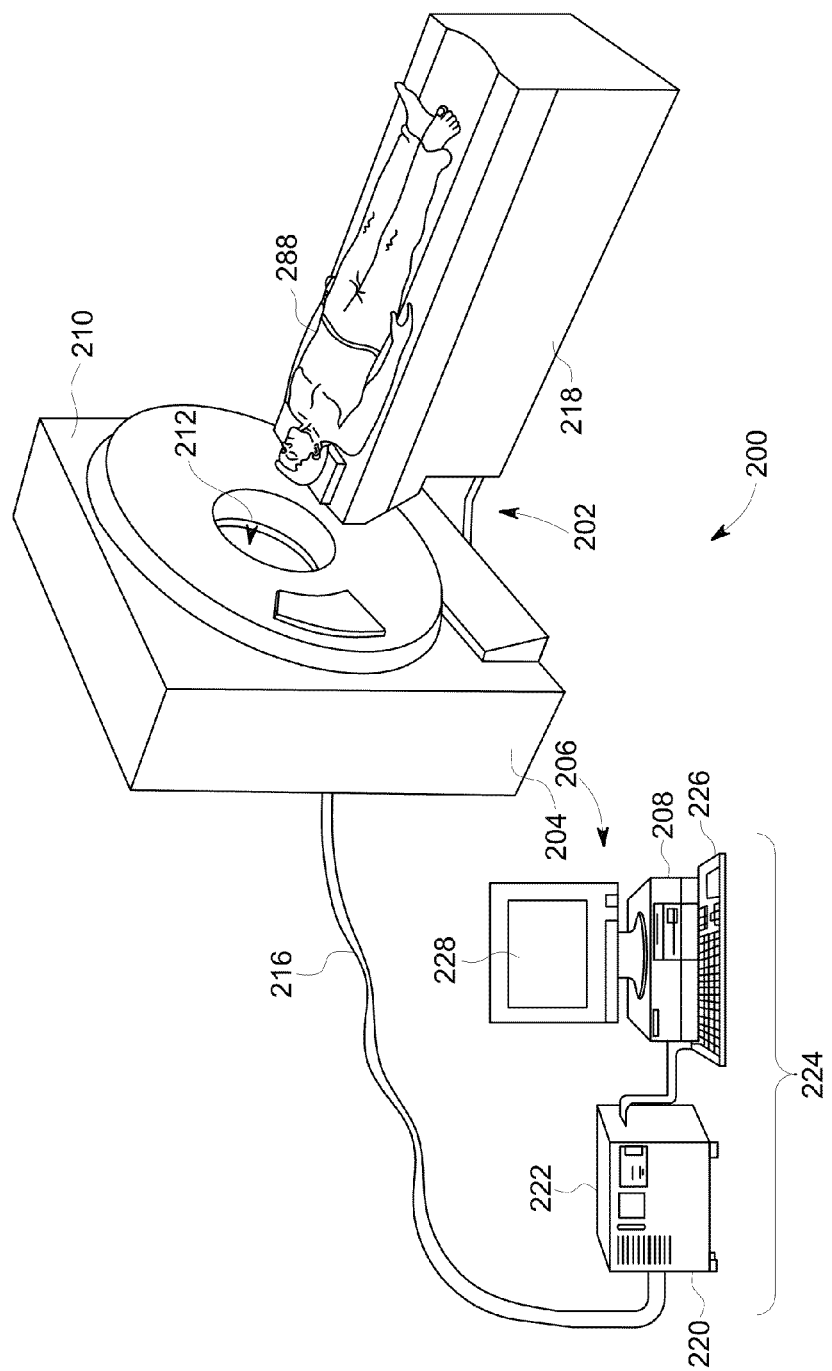
FIG. 15 is a pictorial view of an MRI system formed in accordance with various embodiments.
Figure 16:
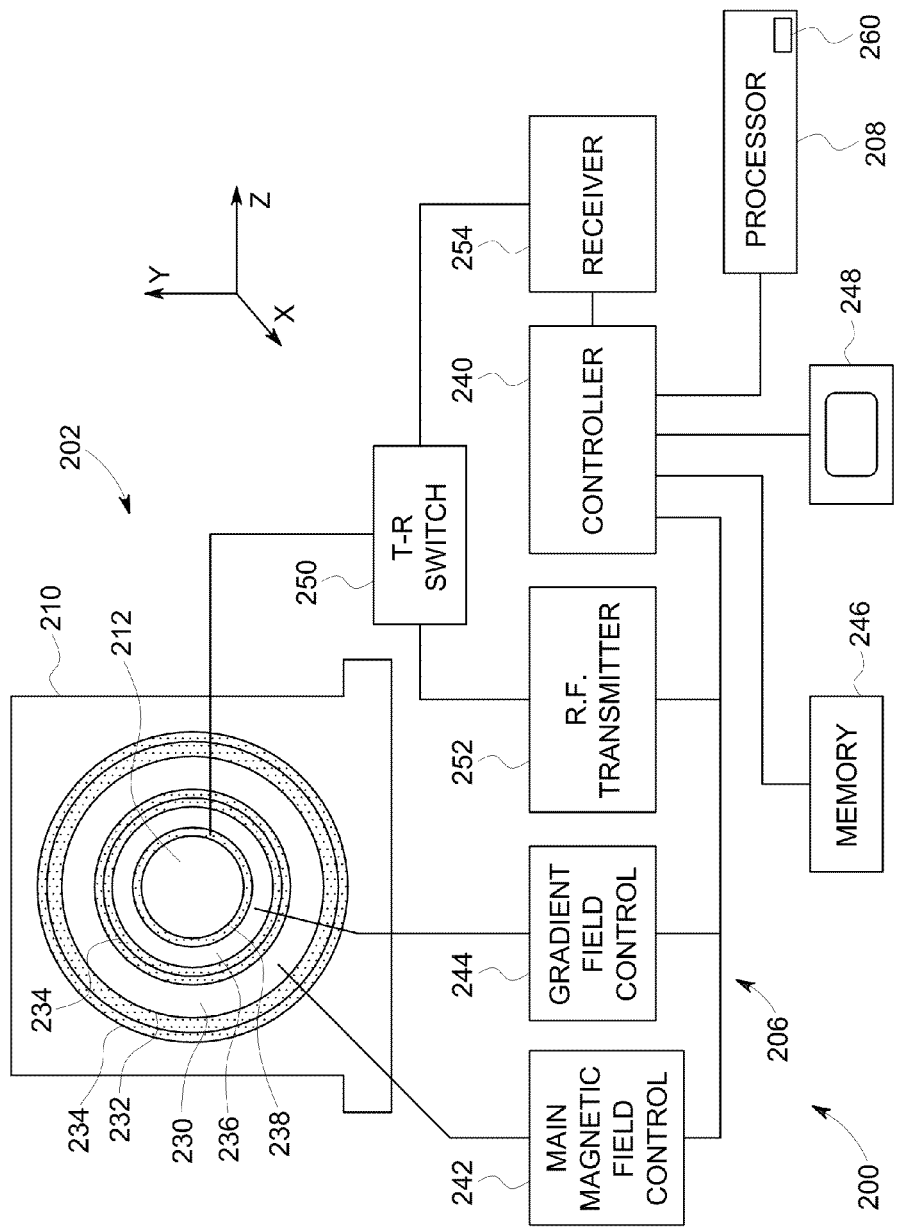
FIG. 16 is a schematic block diagram illustrating the MRI system of FIG. 15.

The MRI system 200 may be embodied as illustrated in FIGS. 15 and 16. The MRI system 200 includes an imaging portion 202 having an imaging unit 204 (e.g., imaging scanner) and a processing portion 206 that may include a processor 208 or other computing or controller device, which includes the controller/processor 300 (shown in FIG. 14). In particular, the imaging unit 204 enables the MRI system 200 to scan the patient 288 to acquire image data, which may be image data of all or a portion of the object or patient 288. The imaging unit 204 includes a gantry 210 that includes one or more imaging components (e.g., magnets or magnet windings within the gantry 210) that allow acquisition of the image data. In multi-modality imaging systems, in addition to the magnet(s) for magnetic resonance imaging, an x-ray source and detector for computed-tomography imaging, or gamma cameras for nuclear medicine imaging may be provided. The imaging components produce signals that represent image data that is communicated to the processing portion 206 via a communication link 216 that may be wired or wireless. It should be noted that the signals may be configured in different protocols, etc. It should also be noted that during an imaging scan by the imaging unit 204, the gantry 210 and the imaging components mounted thereon or therein may remain stationary or rotate about or along a center of rotation defining an examination axis through a bore 212. The patient 288 may be positioned within the gantry 210 using, for example, a motorized table 218.

Thus, in operation an output of one or more of the imaging components is transmitted to the processing portion 206, and vice versa, which for example, may include, transmitting signals to or from the processor 208 through a control interface 220. The processor 208 also may generate control signals for controlling the position of the motorized table 218 or imaging components based on, for example, user inputs or a predetermined scan. During a scan, image data, such as magnetic resonance image data from the imaging components may be communicated to the processor 208 through a data interface 222 via the control interface 220. The processor 208 and associated hardware and software used to acquire and process data may be collectively referred to as a workstation 224. The workstation 224 includes user input devices, such as a keyboard 226 and/or other input devices such as a mouse, a pointer, and the like, and a monitor 228. The monitor 228 displays image data and may accept input from a user if a touchscreen is available.

For illustrative purposes only, the MRI system 200 may be implemented as shown in FIG. 16, which generally includes the imaging portion 202 and the processing portion 206 that may include a processor or other computing or controller device as described herein. The MRI system 200 generally includes within the gantry 210 a superconducting magnet 230 formed from coils, which may be supported on a magnet coil support structure. A helium vessel 232 (also referred to as a cryostat) surrounds the superconducting magnet 230 and may be filled with liquid helium.

Thermal insulation 234 is provided surrounding the outer surface of the helium vessel 232 and the inner surface of the superconducting magnet 230. A plurality of magnetic gradient coils 236 are provided inside the superconducting magnet 230 and an RF transmit coil 238 is provided within the plurality of magnetic gradient coils 236.

In some embodiments, the RF transmit coil 238 may be replaced with a transmit and receive coil. The components within the gantry 210 generally form the imaging portion 202. It should be noted that although the superconducting magnet 230 is a cylindrical shape, other shapes of magnets can be used.

The processing portion 206 generally includes a controller 240, a main magnetic field control 242, a gradient field control 244, a memory 246, a display device 248, a transmit-receive (T-R) switch 250, one or more RF transmitters 252 and one or more receivers 254. It should be noted that the number of RF transmitters 252 and the number of transmit channels may be the same or may be different. In the exemplary embodiment, an RF field mapping module 260, which may be implemented as a tangible non-transitory computer readable medium within the processor 208, is programmed to perform RF field mapping in accordance with one or more embodiments as described in more detail herein.

In operation, a body of an object, such as the patient 288 (shown in FIG. 14) or a phantom to be imaged, is placed in the bore 212 on a suitable support, for example, a patient table. The superconducting magnet 230 produces a uniform and static main magnetic field Bo across the bore 212. The strength of the electromagnetic field in the bore 212 and correspondingly in the patient 288, is controlled by the controller 240 via the main magnetic field control 242, which also controls a supply of energizing current to the superconducting magnet 230.

The magnetic gradient coils 236, which include one or more gradient coil elements, are provided so that a magnetic gradient can be imposed on the magnetic field Bo in the bore 212 within the superconducting magnet 230 in any one or more of three orthogonal directions x, y, and z. The magnetic gradient coils 236 are energized by the gradient field control 244 and are also controlled by the controller 240.

The RF transmit coil 238, which may include a plurality of coils, is arranged to transmit magnetic pulses (generated according to one or more embodiments) and/or optionally simultaneously detect MR signals from the patient 288 if receive coil elements are also provided, such as a surface coil configured as an RF receive coil. The RF receive coil may be of any type or configuration, for example, a separate receive surface coil. The receive surface coil may be an array of RF coils provided within the RF transmit coil 238.

The RF transmit coil 238 and the receive surface coil are selectably interconnected to one of the RF transmitter 252 or receiver 254, respectively, by the T-R switch 250. The RF transmitter 252 and T-R switch 250 are controlled by the controller 240 such that RF field pulses or signals are generated by the RF transmitter 252 and selectively applied to the patient 288 for excitation of magnetic resonance in the patient 288. While the RF excitation pulses are being applied to the patient 288, the T-R switch 250 is also actuated to disconnect the receive surface coil from the receiver 254.

Following application of the RF pulses, the T-R switch 250 is again actuated to disconnect the RF transmit coil 238 from the RF transmitter 252 and to connect the receive surface coil to the receiver 254. The receive surface coil operates to detect or sense the MR signals resulting from the excited nuclei in the patient and communicates the MR signals to the receiver 254. These detected MR signals are in turn communicated to the controller 240. The controller 240 includes a processor (e.g., image reconstruction processor), for example, that controls the processing of the MR signals to produce signals representative of an image of the patient 288.

The processed signals representative of the image are also transmitted to the display device 248 to provide a visual display of the image. Specifically, the MR signals fill or form a k-space that is Fourier transformed to obtain a viewable image. The processed signals representative of the image are then transmitted to the display device 248.

The various embodiments and/or components, for example, the modules, or components and controllers therein, also may be implemented as part of one or more computers or processors. The computer or processor may include a computing device, an input device, a display unit and an interface, for example, for accessing the Internet. The computer or processor may include a microprocessor. The microprocessor may be connected to a communication bus. The computer or processor may also include a memory. The memory may include Random Access Memory (RAM) and Read Only Memory (ROM). The computer or processor further may include a storage device, which may be a hard disk drive or a removable storage drive such as an optical disk drive, solid state disk drive (e.g., flash RAM), and the like. The storage device may also be other similar means for loading computer programs or other instructions into the computer or processor.

As used herein, the term "computer" or "module" may include any processor-based or microprocessor-based system including systems using microcontrollers, reduced instruction set computers (RISC), application specific integrated circuits (ASICs), logic circuits, and any other circuit or processor capable of executing the functions described herein. The above examples are exemplary only, and are thus not intended to limit in any way the definition and/or meaning of the term "computer".

The computer or processor executes a set of instructions that are stored in one or more storage elements, in order to process input data. The storage elements may also store data or other information as desired or needed. The storage element may be in the form of an information source or a physical memory element within a processing machine.

The set of instructions may include various commands that instruct the computer or processor as a processing machine to perform specific operations such as the methods and processes of the various embodiments of the invention. The set of instructions may be in the form of a software program, which may form part of a tangible non-transitory computer readable medium or media. The software may be in various forms such as system software or application software. Further, the software may be in the form of a collection of separate programs or modules, a program module within a larger program or a portion of a program module. The software also may include modular programming in the form of object-oriented programming. The processing of input data by the processing machine may be in response to operator commands, or in response to results of previous processing, or in response to a request made by another processing machine.

As used herein, the terms "software" and "firmware" are interchangeable, and include any computer program stored in memory for execution by a computer, including RAM memory, ROM memory, EPROM memory, EEPROM memory, and non-volatile RAM (NVRAM) memory. The above memory types are exemplary only, and are thus not limiting as to the types of memory usable for storage of a computer program.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments without departing from their scope. While the dimensions and types of materials described herein are intended to define the parameters of the various embodiments, they are by no means limiting and are merely exemplary. Many other embodiments will be apparent to those of skill in the art upon reviewing the above description. The scope of the various embodiments should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

This written description uses examples to disclose the various embodiments, including the best mode, and also to enable any person skilled in the art to practice the various embodiments, including making and using any devices or systems and performing any incorporated methods. The patentable scope of the various embodiments is defined by the claims, and may include other examples that occur to those skilled in the art. Such other examples are intended to be within the scope of the claims if the examples have structural elements that do not differ from the literal language of the claims, or the examples include equivalent structural elements with insubstantial differences from the literal languages of the claims.

What is claimed is:

1. A non-transitory computer readable storage medium for radio-frequency (RF) field mapping using a processor, the non-transitory computer readable storage medium including instructions to command the processor to:
   encode a $B_1$ phase in at least one magnetic resonance (MR) excitation pulse as an encoded $B_1$ phase MR excitation pulse for at least a subset of a plurality of transmit channels within a magnetic resonance imaging (MRI) system;
   encode a $B_1$ magnitude in at least one off-resonance MR pulse as an encoded $B_1$ magnitude off-resonance MR excitation pulse for at least a subset of the plurality of transmit channels within the MRI system; and
   determine one or more composite $B_1$ fields resulting from a transmission of the at least one encoded $B_1$ phase MR excitation pulse and the at least one encoded $B_1$ magnitude off-resonance MR pulse.

2. The non-transitory computer readable storage medium of claim 1, wherein the instructions command the processor to cause a pulse generator to apply a pulse sequence having the at least one encoded $B_1$ phase MR excitation pulse and the at least one encoded $B_1$ magnitude off-resonance MR pulse.

3. The non-transitory computer readable storage medium of claim 1, wherein the instructions command the processor to cause a pulse generator to apply a pulse sequence having the at least one encoded $B_1$ phase MR excitation pulse and a different pulse sequence having the at least one encoded $B_1$ magnitude off-resonance MR pulse.

4. The non-transitory computer readable storage medium of claim 1, wherein the at least one encoded $B_1$ magnitude off-resonance MR pulse comprises a Bloch-Siegert shift pulse.

5. The non-transitory computer readable storage medium of claim 1, wherein the instructions command the processor to cause a pulse generator to apply a spin echo pulse sequence having at least one of the encoded $B_1$ phase MR excitation pulse or the encoded $B_1$ magnitude off-resonance MR pulse, and wherein the spin echo pulse sequence comprises a refocusing pulse.

6. The non-transitory computer readable storage medium of claim 1, wherein the instructions command the processor to calculate one or more $B_1$ fields for the plurality of transmit channels using the inverse of the following:

$$B_{1,m} = \sum_i^N w_{m,n} B_{1,n}$$

where $B_{1,m}$ is the complex, composite $B_1$ field for weighting combination m, with M total combinations, $B_{1,n}$ is the complex $B_1$ field from a single channel of the plurality of transmit channels, with N total number of transmit channels that are parallel channels, and $w_{m,n}$ is the complex weighting of each channel n, for each weighting combination m.

7. The non-transitory computer readable storage medium of claim 1, wherein the instructions command the processor to cause a pulse generator to apply a pulse sequence having at least one of the encoded $B_1$ phase MR excitation pulse or the encoded $B_1$ magnitude off-resonance MR pulse, wherein the pulses have a same amplitude.

8. The non-transitory computer readable storage medium of claim 1, wherein the instructions command the processor to use a channel weighting to determine the plurality of channels from which the at least one encoded $B_1$ phase MR excitation pulse and the at least one encoded $B_1$ magnitude off-resonance MR pulse are transmitted.

9. The non-transitory computer readable storage medium of claim 1, wherein the instructions command the processor to determine a $B_1$ magnitude and a $B_1$ phase of the one or more composite $B_1$ fields.

10. The non-transitory computer readable storage medium of claim 1, wherein the instructions command the processor to cause a pulse generator to apply to a plurality of subsets of the plurality of transmit channels, a pulse sequence having at least one of the encoded $B_1$ phase MR excitation pulse or the encoded $B_1$ magnitude off-resonance MR pulse.

11. The non-transitory computer readable storage medium of claim 10, wherein the pulse sequences are applied in a rotating sequence to the plurality of subsets of the plurality of transmit channels.

12. The non-transitory computer readable storage medium of claim 1, wherein the instructions command the processor to calculate one or more $B_1$ fields for the plurality of transmit channels using the determined one or more composite $B_1$ fields.

13. The non-transitory computer readable storage medium of claim 1, wherein the instructions command the processor to use a channel weighting to determine the plurality of channels from which the at least one encoded $B_1$ phase MR excitation pulse and the at least one encoded $B_1$ magnitude off-resonance MR pulse are transmitted, the channel weighting selected based on at least one of optimizing a conditioning for an inverse problem solution, reducing or minimizing noise or noise sensitivity, or reducing or minimizing a specific absorption rate.

14. A magnetic resonance imaging (MRI) system comprising:
   an imaging portion having an imaging unit configured to acquire magnetic resonance (MR) data, wherein the imaging portion includes a plurality of radio-frequency (RF) coils excited by one or more pulses from a pulse generator using a plurality of transmit channels; and
   a processing portion having a processor configured to generate the one or more pulses for the plurality of RF coils by (i) encoding a $B_1$ phase in at least one excitation pulse as an encoded $B_1$ phase excitation pulse for at least a subset of the plurality of transmit channels and (ii) encoding a $B_1$ magnitude in at least one pulse, which is off-resonance, as an encoded off-resonance $B_1$ magnitude pulse for at least a subset of the plurality of transmit channels, and further configured to determine one or more composite $B_1$ fields resulting from the transmission of the at least one encoded $B_1$ phase excitation pulse and the at least one encoded off-resonance $B_1$ magnitude pulse.

15. The MRI system of claim 14, wherein the processor is further configured to cause the pulse generator to apply a pulse sequence having the at least one encoded $B_1$ phase excitation pulse and the at least one encoded off-resonance $B_1$ magnitude pulse.

16. The MRI system of claim 14, wherein the processor is further configured to cause the pulse generator to apply a pulse sequence having the at least one encoded $B_1$ phase excitation pulse and a different pulse sequence having the at least one encoded off-resonance $B_1$ magnitude pulse.

17. The MRI system of claim 14, wherein the at least one encoded off-resonance $B_1$ magnitude pulse comprises a Bloch-Siegert shift pulse.

18. The MRI system of claim 14, wherein the processor is further configured to cause the pulse generator to apply a spin echo pulse sequence having at least one of the encoded $B_1$ phase excitation pulse or the encoded off-resonance $B_1$ magnitude pulse, and wherein the spin echo pulse sequence comprises a refocusing pulse.

19. The MRI system of claim 14, wherein the processor is further configured to calculate one or more $B_1$ fields for the plurality of transmit channels using the inverse of the following:

$$B_{1,m} = \sum_i^N w_{m,n} B_{1,n}$$

where $B_{1,m}$ is the complex, composite $B_1$ field for weighting combination m, with M total combinations, $B_{1,n}$ is the complex $B_1$ field from a single channel of the plurality of transmit channels, with N total number of transmit channels that are parallel channels, and $w_{m,n}$ is the complex weighting of each channel n, for each weighting combination m.

20. The MRI system of claim 14, wherein the processor is further configured to cause the pulse generator to apply a pulse sequence having at least one of the encoded $B_1$ phase excitation pulse or the encoded off-resonance $B_1$ magnitude pulse, wherein the pulses have a same amplitude.

21. The MRI system of claim 14, wherein the processor is further configured to use a channel weighting to determine the plurality of transmit channels from which the at least one encoded $B_1$ phase excitation pulse and the at least one encoded off-resonance $B_1$ magnitude pulse are transmitted.

22. The MRI system of claim 14, wherein the processor is further configured to cause the pulse generator to apply to a plurality of subsets of the plurality of transmit channels, a pulse sequence having at least one of the encoded $B_1$ phase excitation pulse or the encoded off-resonance $B_1$ magnitude pulse.

23. The MRI system of claim 14, wherein the processor is further configured to calculate one or more $B_1$ fields for the plurality of channels using the determined one or more composite $B_1$ fields.

24. The MRI system of claim 14, wherein the processor is further configured to use a channel weighting to determine the plurality of transmit channels from which the at least one encoded $B_1$ phase excitation pulse and the at least one encoded off-resonance $B_1$ magnitude pulse are transmitted, the channel weighting selected based on at least one of optimizing a conditioning for an inverse problem solution, reducing or minimizing noise or noise sensitivity, or reducing or minimizing a specific absorption rate.

25. A method for interference radio-frequency (RF) mapping for a parallel transmit magnetic resonance imaging (MRI) system, the method comprising:
  encoding with a pulse generator a $B_1$ phase in at least one magnetic resonance (MR) excitation pulse as an encoded $B_1$ phase MR excitation pulse sequence for at least a subset of a plurality of transmit channels within the parallel transmit MRI system;
  encoding with the pulse generator a $B_1$ magnitude in at least one off-resonance Bloch-Siegert MR pulse as an encoded $B_1$ magnitude off-resonance Bloch-Siegert MR pulse sequence for at least a subset of the plurality of transmit channels within the MRI system;
  generating one or more encoded $B_1$ phase MR excitation pulse sequences or encoded $B_1$ magnitude off-resonance Bloch-Siegert MR pulse sequences with a complex weighting using the pulse generator;
  transmitting the encoded $B_1$ phase MR excitation pulse sequence or the encoded $B_1$ magnitude off-resonance Bloch-Siegert MR pulse sequence using one or more subsets of the plurality of transmit channels; and
  determining with a processor one or more composite $B_1$ fields resulting from the transmission of the encoded $B_1$ phase MR pulse sequence or the encoded $B_1$ magnitude off-resonance Bloch-Siegert MR pulse sequence.

26. The method of claim 25, further comprising calculating with a processor one or more $B_1$ fields for the plurality of transmit channels using the determined composite $B_1$ fields.

27. The method of claim 25, further comprising using a channel weighting to determine the plurality of transmit channels from which the at least one encoded $B_1$ phase excitation pulse sequence and the at least one encoded off-resonance $B_1$ magnitude pulse sequence are transmitted, the channel weighting selected based on at least one of optimizing a conditioning for an inverse problem solution, reducing or minimizing noise or noise sensitivity, or reducing or minimizing a specific absorption rate.

* * * * *